(12) United States Patent
Lin et al.

(10) Patent No.: US 11,963,421 B2
(45) Date of Patent: Apr. 16, 2024

(54) DISPLAY DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 413 days.

(21) Appl. No.: 17/142,254

(22) Filed: Jan. 6, 2021

(65) Prior Publication Data
US 2021/0249476 A1    Aug. 12, 2021

(30) Foreign Application Priority Data

Feb. 6, 2020    (CN) .......................... 202010081670.6

(51) Int. Cl.
*H10K 59/38*        (2023.01)
*H10K 59/121*       (2023.01)

(52) U.S. Cl.
CPC .......... *H10K 59/38* (2023.02); *H10K 59/121* (2023.02)

(58) Field of Classification Search
CPC ............. H10K 50/8426; H10K 50/868; H10K 2102/311; H10K 50/85; H10K 59/131; H10K 59/12; H10K 59/00; H10K 50/84; H10K 50/844; H10K 50/86; H10K 77/111; G06F 1/1626; G06F 1/1637; G06F 1/1652; G06F 2203/04102; G02B 1/10; G02B 5/30; G02B 6/005; H05K 1/0281; H05K 1/147; H05K 2201/10128; H04M 1/0268; H04M 1/0277; Y02E 10/549; G09F 9/301
See application file for complete search history.

(56) References Cited

U.S. PATENT DOCUMENTS

| | | | | |
|---|---|---|---|---|
| 2005/0248929 | A1* | 11/2005 | Kawamura | H10K 50/86 313/485 |
| 2015/0349029 | A1* | 12/2015 | Choi | H10K 59/12 257/40 |
| 2016/0170262 | A1* | 6/2016 | Saneto | G02F 1/133603 349/71 |
| 2017/0104035 | A1* | 4/2017 | Lee | H10K 59/38 |
| 2017/0139269 | A1* | 5/2017 | Asakawa | G02F 1/133514 |
| 2018/0006092 | A1  | 1/2018 | Rieger | |
| 2019/0181189 | A1  | 6/2019 | Chang | |
| 2020/0119101 | A1* | 4/2020 | Lee | H10K 59/38 |
| 2020/0212120 | A1* | 7/2020 | Yang | H10K 59/351 |
| 2020/0258945 | A1* | 8/2020 | Joo | H10K 50/865 |
| 2020/0303676 | A1* | 9/2020 | Lin | H10K 50/852 |

* cited by examiner

*Primary Examiner* — Kevin Quarterman
(74) *Attorney, Agent, or Firm* — Winston Hsu

(57) ABSTRACT

A display device includes a plurality of pixels. At least one of the pixels includes a green light wavelength conversion layer, a color filter layer and a light path. The light path passes through the green light wavelength conversion layer and then passes through the color filter layer. The color filter layer includes a green pigment and a yellow pigment.

7 Claims, 10 Drawing Sheets

DISPLAY DEVICE

BACKGROUND OF THE DISCLOSURE

1. Field of the Disclosure

The present disclosure relates to a display device, and more particularly to a display device with a color filter layer including a green material and a yellow material.

2. Description of the Prior Art

An organic light-emitting diode (OLED) is a light emitting element with various applications. However, the color quality or the light intensity of the output light (such as green light) of the current display devices including organic light-emitting diodes still needs further improvement.

SUMMARY OF THE DISCLOSURE

In view of this, the present disclosure proposes a display device which is able to improve the color quality of output light or to enhance the green light intensity of the output light.

According to one embodiment of the present disclosure, a display device is provided. The display device includes a plurality of pixels. At least one of the pixels includes a green light wavelength conversion layer, a color filter layer, and a light path. The light path passes through the green light wavelength conversion layer and then passes through the color filter layer. The color filter layer includes a green material and a yellow material. The green material includes a green pigment or a green dye or a combination thereof. The yellow material includes a yellow pigment or a yellow dye or a combination thereof.

According to the display device of the embodiments of the present disclosure, the peak value of the maximum transmittance of the green light wavelength of the green color filter layer may be substantially the same as the peak value of the emission of the light wavelength of the green light wavelength conversion layer by adjusting the mixing ratio of a weight of the green material to a total weight of the green material and the yellow material. In such a way, the problem of blue light leakage may be improved, to enhance the color quality of the output light, or to improve the green light intensity of the output light.

These and other objectives of the present disclosure will no doubt become obvious to those of ordinary skill in the art after reading the following detailed description of the embodiment that is illustrated in the various figures and drawings.

DETAILED DESCRIPTION

Figure 1A:
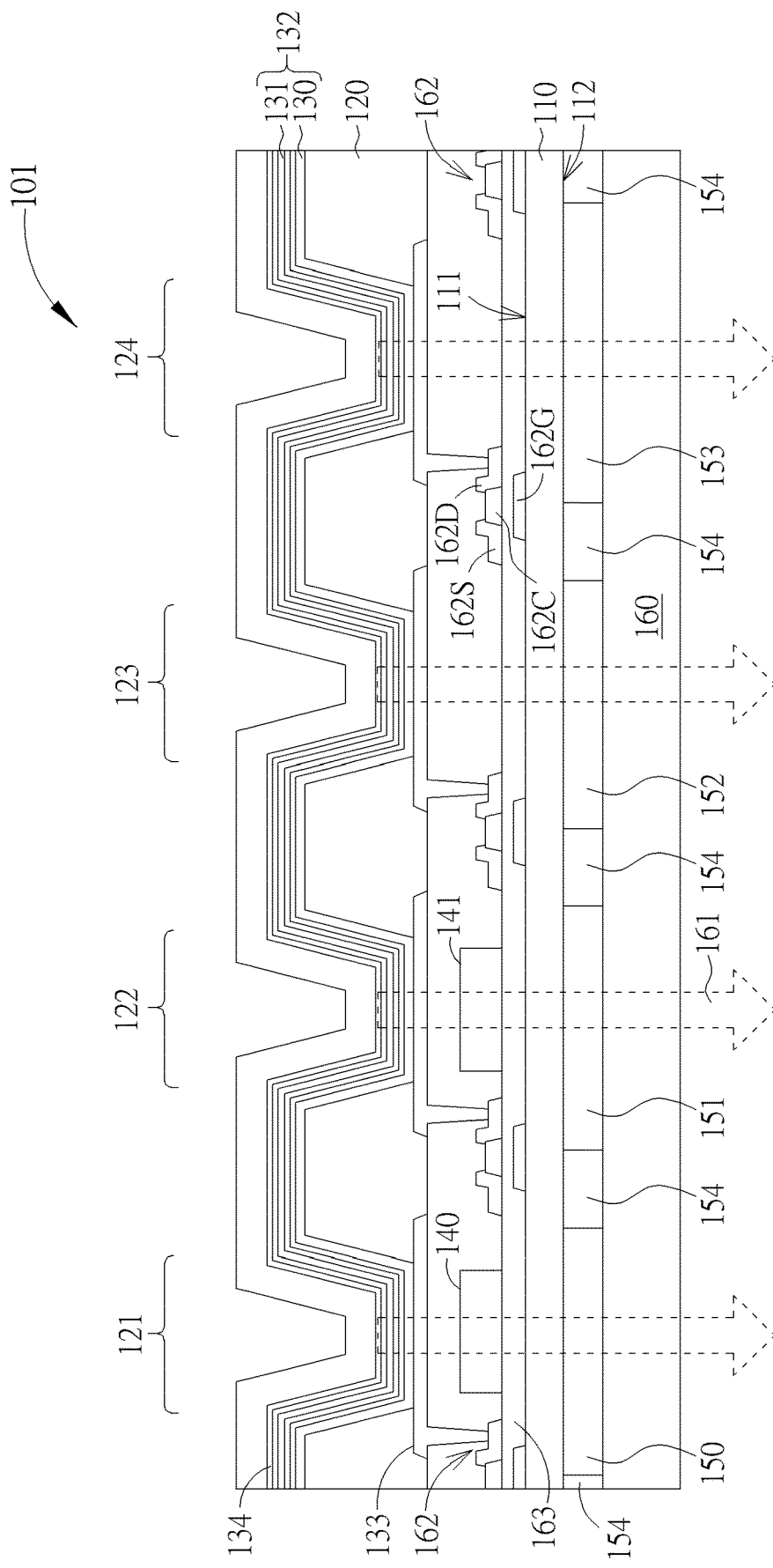
FIG. 1A is a cross-sectional view of a structure of the display device according to an embodiment of the present disclosure.

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to".

When an element or a layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented. In addition, the word "electrically connected" may include any direct or indirect electrical connection means.

The terms "about", "substantially", "equal", or "same" generally mean within 20% of a given value or range, or mean within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The technical features in different embodiments described in the following may be replaced, recombined, or mixed with one another to constitute another embodiment without departing from the spirit of the present disclosure.

A blue light organic light-emitting diode emits blue light or white light by mixing. White light can be achieved by mixing blue light with other colors of light. For example, a binary system in which blue light is mixed with yellow light, or a ternary system in which blue light is mixed with red light and with green light. Generally in a binary system or in a ternary system, a blue light organic light-emitting diode in association with a corresponding color conversion layer may be used to generate light of other colors, such as red light, yellow light, or green light. In addition, white light organic light-emitting diodes may also be used to directly emit white light.

If a blue light organic light-emitting diode is matched with a green light wavelength conversion layer, the green light wavelength conversion material in the green light wavelength conversion layer, such as a quantum dot conversion material, can convert blue light of a shorter wavelength into green light of a longer wavelength. If the green light wavelength conversion material fails to completely convert all the blue light into green light of a longer wavelength, it may results in the unconverted blue light remaining in the output green light, so that the output light is not pure green light and the color quality of the output light is deteriorated. If the green pixels use poor pigments or dyes or a combination thereof, the intensity of the output green light is reduced or the green color becomes impure. A display device disclosed in the present disclosure may improve the color quality of the output light, or improve the green light intensity of the output light.

FIG. 1A is a cross-sectional view of a structure of the display device 101 according to an embodiment of the present disclosure. The display device 101 may include a substrate 110, a pixel definition layer (PDL) 120, at least one light-emitting layer 132, a plurality of color conversion elements, a plurality of color filter layers, and a polarizer 160, but the present disclosure is not limited thereto. The substrate 110 may have two opposite sides, such as a first surface 111 and a second surface 112, and the light-emitting layer 132 is disposed on the first surface 111 of the substrate 110, but it is not limited thereto. The embodiment of the present disclosure illustrates a bottom-emission type display device 101, and the color conversion elements and the color filter layers are respectively disposed on different surfaces of two sides of the substrate 110, for example, respectively disposed on the first surface 111 and on the second surface 112. The light which is generated by the light-emitting layer 132 travels toward the substrate 110 and leaves the substrate 110 from the second surface 112 to display an image or a picture.

The substrate 110 may be a rigid transparent substrate or a flexible transparent substrate, and the material of the substrate 110 may be an organic material or an inorganic material. The pixel defining layer 120 may be disposed on the first surface 111 of the substrate 110 to define a plurality of pixels, for example, to define the locations of the red pixels 121, the green pixels 122, the blue pixels 123, and the white pixels 124, but the present disclosure is not limited thereto. The light-emitting layer 132 may be used to generate light of a predetermined wavelength, such as blue light, a binary system mixing blue light with yellow light, or a ternary system mixing blue light with red light and with green light, but the present disclosure is not limited thereto. FIG. 1A illustrates an embodiment of the binary system in which blue light is mixed with yellow light, so the light-emitting layer 132 may include a blue light-emitting layer 130 and a yellow light-emitting layer 131. When the main light-emitting materials of the light-emitting layer 132 is an organic light-emitting material, the light-emitting layer 132 may also include other film layers which facilitate the emission of light, such as (but not limited to) a hole injection layer (HIL), a hole transport layer ((HTL), a light emission layer (EL), an electron transport layer (ETL), an electron injection layer (EIL), and/or a charge generation layer (CGL), but this disclosure is not limited thereto. In addition, the light-emitting layer of the display device 101 may be electrically connected to the first electrode layer 133 and the second electrode layer 134. The first electrode layer 133 may be one of a cathode and an anode, and the second electrode layer 134 may be the other one of the cathode and the anode.

A plurality of color conversion elements may be respectively and correspondingly disposed on the light-emitting side below the plurality of pixels. For example, the color conversion elements may include a red light wavelength conversion layer 140 and a green light wavelength conversion layer 141, but the present disclosure is not limited thereto. There is no need to arrange a color conversion element in the blue pixel 123 or in the white pixel 124, but the present disclosure is not limited thereto. For example (but not limited to) a blue light wavelength conversion layer, an optical adjustment layer, a transparent layer or other suitable materials may be provided on the light emitting side below the blue pixel 123 as required. Or, an optical adjustment layer, a transparent layer or other suitable materials may be provided on the light emitting side below the white pixel 124 as required. The color conversion element may be a wavelength conversion element to adjust the wavelength of the output light of the display device 101, but the present disclosure is not limited thereto. For example, the color conversion element may include, but is not limited to, quantum dots, a phosphor material, a fluorescent material, a pigment, a dye, scattering particles, or a color filter layer. The quantum dots may be composed of semiconductor nanocrystalline structures, such as CdSe, CdS, CdTe, ZnSe, ZnTe, ZnS, HgTe, InAs, $Cd_{1-x}Zn_xSe_{1-y}S_y$, CdSe/ZnS, InP, and GaAs, but the present disclosure is not limited thereto.

When the quantum dots are excited by the input light, the input light may be accordingly converted into the emission light of other colors. The colors of the emission light may be adjusted by changing the materials, the sizes, or the shapes of the quantum dots. In some embodiments, the quantum dots may include spherical particles, rod-shaped particles, or particles having any other suitable shapes, as long as a suitable quantum dot material may be selected to serve as the color conversion element for light conversion. The color conversion element may be used to output visible light. For example, the color conversion element may output blue light, cyan light, green light, yellow light, red light, or a combination thereof, but the present disclosure is not limited thereto. In the present disclosure, the output light passing through the light path of the color filter layer may be regarded as the visible light of various display devices to be received by a user (observer).

The color filter layers may be respectively and correspondingly disposed on the light-emitting sides below different pixels, for example, there may be a red color filter layer 150, a green color filter layer 151, and a blue color filter layer 152, but the present disclosure is not limited thereto. There may be no need to arrange a color filter layer for the white pixels 124, or a transparent material layer 153 or other suitable materials may be provided at corresponding positions, but the present disclosure is not limited thereto. Each color filter layer may include a suitable color material. For example, the green color filter layer 151 may include a green material, and the green material may include a green pigment or a green dye, or a combination thereof, but the present disclosure is not limited thereto. The green pigment may comprise a material included a metal component selected from a group consisting of copper and zinc. For example, the green pigment may be C.I. Pigment Green 36, C.I. Pigment Green 58, or a combination thereof, but the present disclosure is not limited thereto. The polarizer 160 may be used to adjust the quality of the output light. In this embodiment, there may be a light-shielding layer 154 (or a black matrix, BM) provided between the adjacent red color filter layer 150, the green color filter layer 151, and the blue color filter layer 152. The material of the light-shielding layer 154 may include, for example, a black material, a black photoresist, a black printing ink, a black resin, other suitable materials, or a combination of the above materials, but the present disclosure is not limited thereto.

The color conversion element corresponding to each pixel and to the color filter layer form a light path (as shown by the arrow), so that the light path passes through the corresponding wavelength conversion layer and then passes through the corresponding color filter layer. For example, the green light path 161 may go from the light-emitting layer 132 through the green light wavelength conversion layer 141 and through the green color filter layer 151. In other words, the green color filter layer 151 including a green material may be provided at the light exit of the green light wavelength conversion layer 141 of the green pixel 122.

The display device 101 may include a transistor 162 to control the on/off state of the light-emitting layer 132. The transistor 162 may be, for example, a thin film transistor (TFT), but the present disclosure is not limited thereto. The thin film transistor may be used as a switching element for driving a light emitting element in the display device 101. The thin film transistor may include a semiconductor layer 162C, a drain electrode 162D, a source electrode 162S, and a gate electrode 162G. The semiconductor layer 162C includes a semiconductor material, for example, the semiconductor material may include amorphous silicon or low temperature poly silicon, or a metal oxide material, for example, an indium gallium zinc oxide (IGZO). In some embodiments, different transistors 162 may include different semiconductor materials, but the present disclosure is not limited thereto. The drain electrode 162D and the source electrode 162S are respectively electrically connected to a part of the semiconductor layer 162C. The gate electrode 162G is separated from the semiconductor layer 162C by a gate dielectric layer 163. The gate electrode 162G, the source electrode 162S, and the drain electrode 162D may include a conductive material (such as a metal, but the present disclosure is not limited thereto). The structure of the thin film transistor shown in FIG. 1A is for illustration purposes only, not for limiting the possible types or structures of the thin film transistor disclosed herein, so any other suitable thin film transistor structure may be used instead of the thin film transistor shown here.

The display device of the present disclosure is not limited to the above embodiments. The following continues to disclose other embodiments or variations of the present disclosure. In order to simplify the description and point out the differences between the embodiments or variations, the same elements are labeled with the same reference numerals in the following, and similar details will not be mentioned again. In addition, the materials and thickness of each film layer and the conditions of the process steps in the subsequent embodiments of the present disclosure may refer to the above embodiments for the details, and therefore the details may not be described again.

Figure 1B:
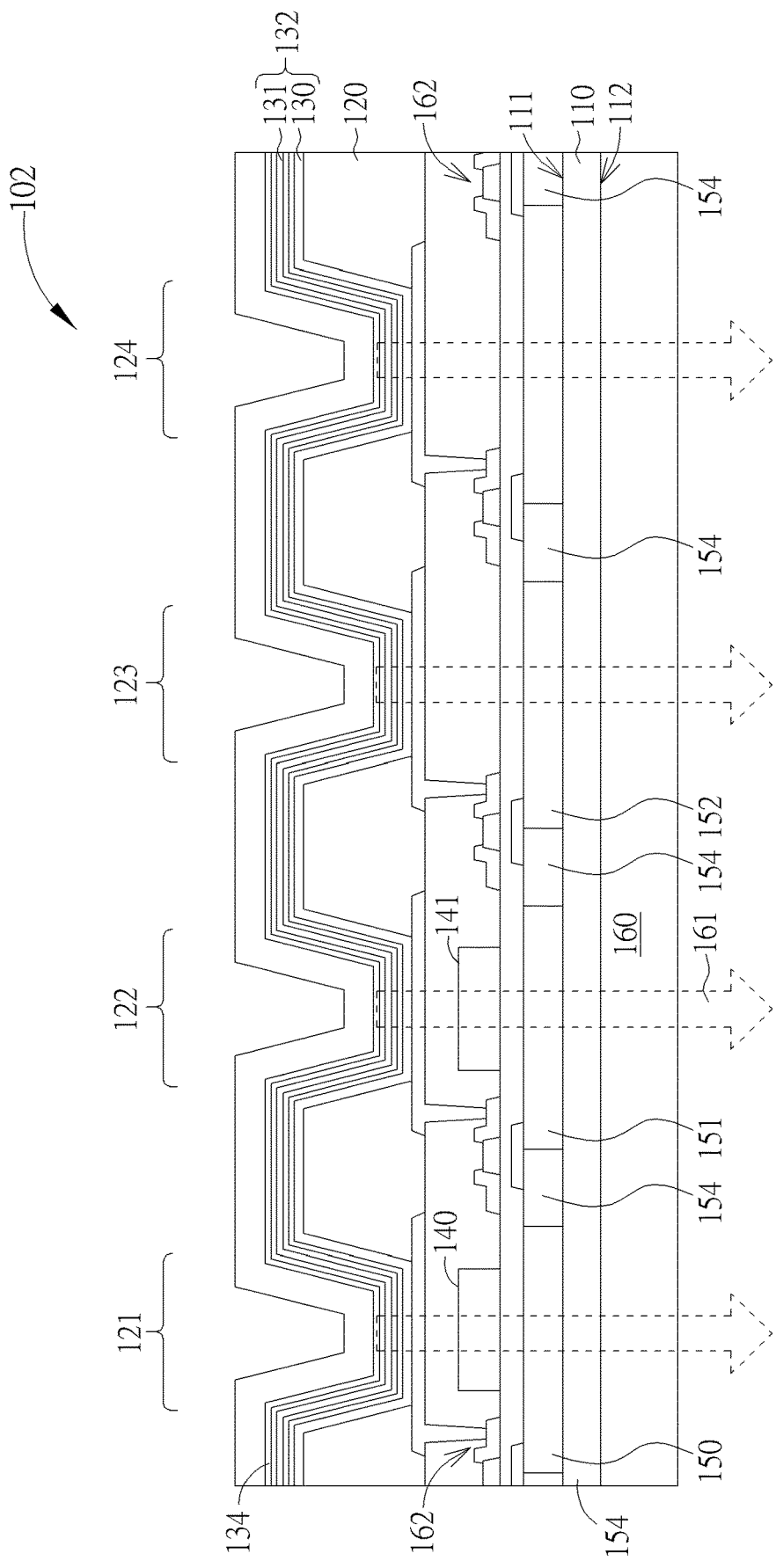
FIG. 1B is a cross-sectional view of a structure of a display device according to a variation of the embodiment of the disclosure.

FIG. 1B is a cross-sectional view of a structure of the display device 102 according to a variation of the above embodiment of the disclosure. FIG. 1B illustrates a bottom-emitting type display device 102. A plurality of color conversion elements and a plurality of color filter layers may be respectively and correspondingly disposed on the same surface of the substrate 110, for example, may be respectively and correspondingly disposed on the first surface 111. In other words, the red color filter layer 150, the green color filter layer 151, and the blue color filter layer 152 may be disposed between the substrate 110 and the light-emitting layer 132.

Figure 2:
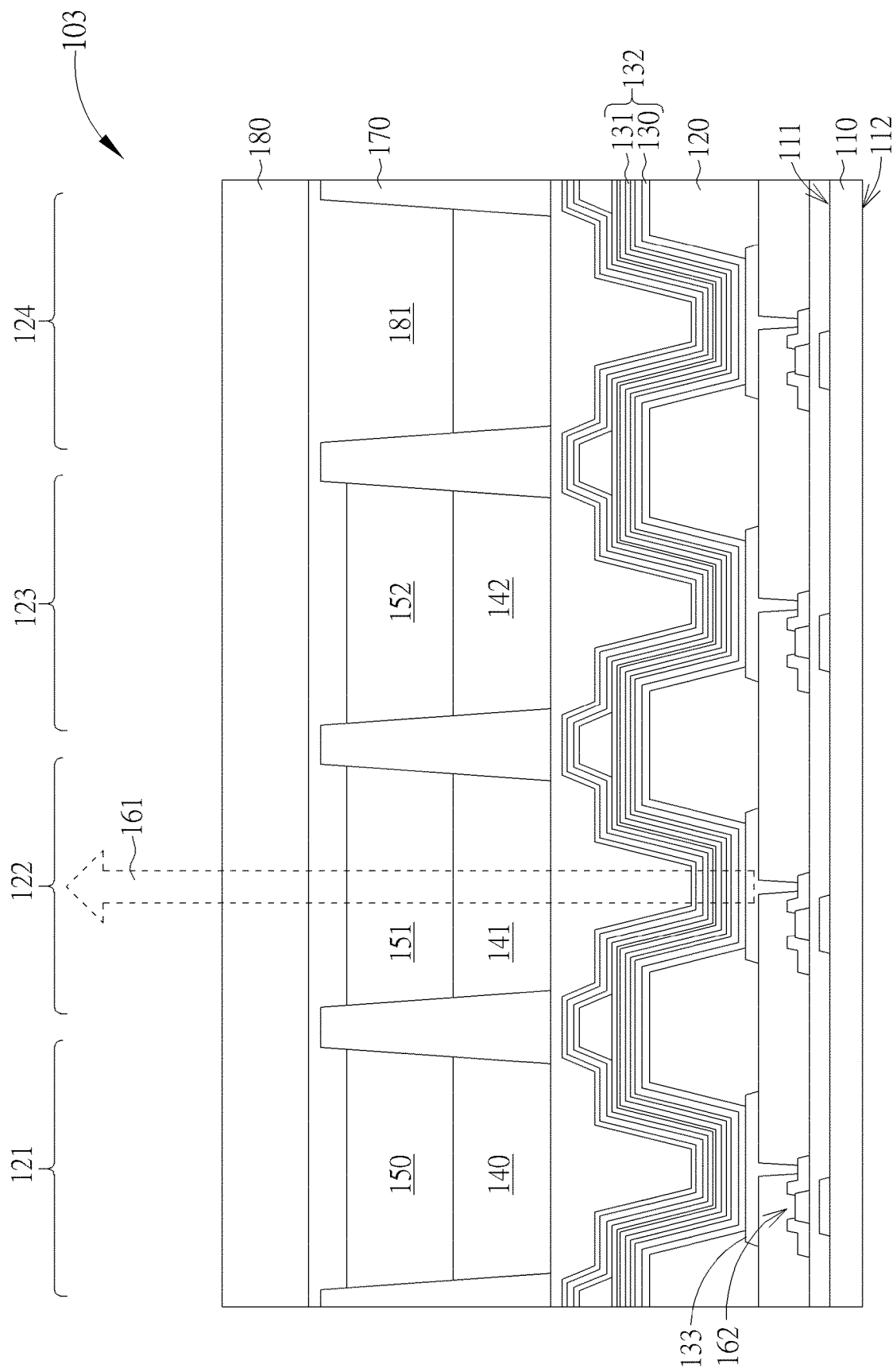
FIG. 2 is a cross-sectional view of a structure of a display device according to another embodiment of the present disclosure.

FIG. 2 is a cross-sectional view of a structure of the display device 103 according to another embodiment of the present disclosure. The display device 103 is a top-emission type display, and may include a substrate 110, a pixel defining layer 120, a light-emitting layer 132, a plurality of color conversion elements, a plurality of color filter layers, a light-shielding isolation layer 170, and a cover layer 180, but the present disclosure is not limited thereto. The substrate 110 may have two opposite sides, such as a first surface 111 and a second surface 112. In the display device 103 of the disclosed embodiment, a plurality of color conversion elements and a plurality of color filter layers may be respectively and correspondingly disposed on the same surface of the substrate 110, for example, respectively and correspondingly disposed on the first surface 111, and the light-emitting layer 132 is disposed between the color conversion elements and the substrate 110, or between the color filter layers and the substrate 110.

A plurality of color conversion elements in the display device 103 may include a red light wavelength conversion layer 140 and a green light wavelength conversion layer 141. A plurality of color filter layers may include, for example, a red color filter layer 150, a green color filter layer 151, and a blue color filter layer 152 which are respectively and correspondingly disposed above the light-emitting layer 132 of the pixel 121, of the pixel 122, of the pixel 123, and of the pixel 124 to form a stack structure in which a red light wavelength conversion layer 140 is disposed between the red color filter layer 150 and the light-emitting layer 132, the green light wavelength conversion layer 141 is disposed between the green color filter layer 151 and the light-emitting layer 132, and the blue color filter layer 152 is disposed between the transparent material layer 142 and the light-emitting layer 132. The light-shielding isolation layer 170 may be used to define the positions of the red light wavelength conversion layer 140, of the green light wavelength conversion layer 141, of the transparent material layer 142, and of the red color filter layer 150, of the green color filter layer 151, of the blue color filter layer 152, or to reduce the possibility of material overflow during the manufacturing process of the color conversion element precursor and the color filter layer precursor. The material of the light-shielding isolation layer 170 may be, for example, a black material, a black ink, or a black resin material, but the present disclosure is not limited thereto. A thin film encapsulation protection layer 181 may be formed by using a thin film encapsulation (TFE) method, so that the thin film encapsulation protection layer 181 may cover or protect the display device 103. The cover layer 180 may be used to protect various elements in the display device 103 and reduce the influence or the damage of the external environment.

The color conversion element and the color filter layer which correspond to each pixel form a light path, so that the light path passes through the corresponding color conversion element and through the corresponding color filter layer. For example, the upward green light path 161 may pass through the green light wavelength conversion layer 141, the green color filter layer 151, and the cover layer 180.

In the structure of an organic light-emitting diode combined with quantum dots, it is necessary to diminish the disadvantage which involves that the green color filter layer 151 has considerable transmittance in the blue light band to cause blue light leakage so as to reduce the possibility of blue light leakage of the green pixels 122 if the green pixel 122 is needed to emit pure green light. The pure green light which is mentioned in this disclosure may have different wavelength ranges according to different specifications. For example, according to the specifications of DCIP 3, the maximum peak wavelength of green light is 537 nm, and the wavelength range is between 535 nm (nanometer) and 540 nm. Or alternatively, according to the specifications of Rec 2020, the maximum peak wavelength of green light is 532 nm, but the present disclosure is not limited thereto. In addition to reducing the blue light leakage of the green pixel 122, it is also possible to improve the transmission spectrum of the green color filter layer 151 to be substantially the same as the emission spectrum of the green light wavelength conversion layer 141.

Figure 3:
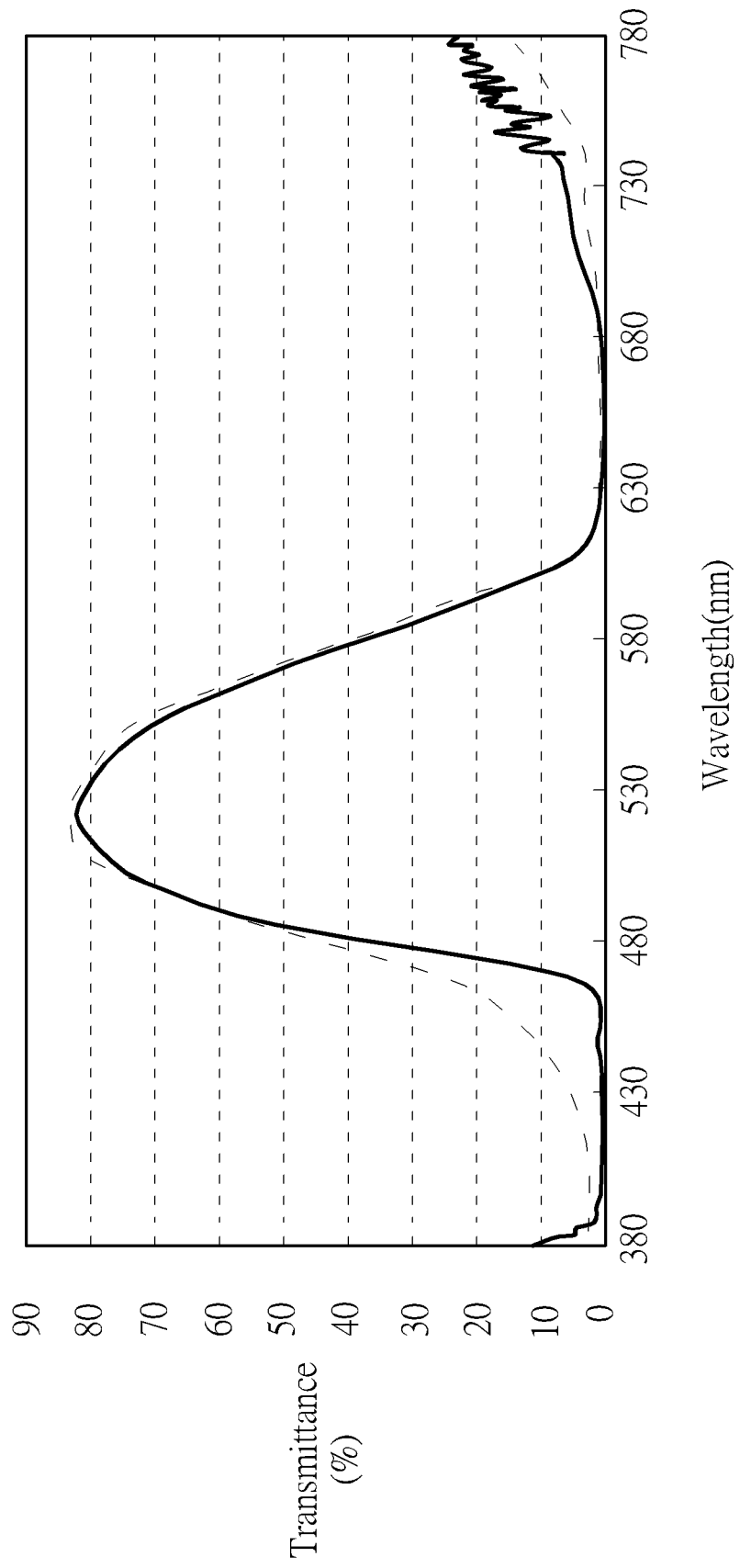
FIG. 3 is a schematic diagram showing a comparison between the wavelength of the green color filter layer after the improvement and the green color filter layer before the improvement regarding transmittance in the display device according to the embodiment of the present disclosure.

FIG. 3 is a schematic diagram showing a comparison of the wavelength versus transmittance of the green color filter layer after the improvement and the green color filter layer before the improvement in the display device according to the embodiment of the present disclosure. In the structure of the organic light-emitting diode combined with quantum dots, an appropriate yellow material may be added to the color filter layer close to the light output of the color conversion element if the green pixel needs to output purer green light, that is, to reduce the blue light leakage of the green pixel. The yellow material may include a yellow pigment, a yellow dye, or a combination thereof, but the present disclosure is not limited thereto. The dotted line in FIG. 3 represents the transmittance (%) relative to the wavelength of the green color filter layer before the improvement. It can be observed that the green color filter layer before improvement has obvious transmittance for light in the range between 380 nm and 480 nm, so blue light leakage occurs.

The solid line in FIG. 3 represents the transmittance (%) relative to the wavelength of the green color filter layer in the improved display device according to the above embodiments of the present disclosure. It can be observed in FIG. 3 that the light with a wavelength ranging from 380 nm to 450 nm is basically difficult to pass through the green color filter layer in the display devices of the above-mentioned embodiments of the present disclosure, so the green color filter layer in the display devices according to the above embodiments of the present disclosure basically has a lower blue light transmittance or has no substantial blue light transmittance within this blue light band range. Therefore, by adding a yellow material to the green color filter layer of the above embodiments of the present disclosure, the transmittance of the blue light can be reduced, and the leakage of the blue light can be reduced. In such a way, the green pixels in the display device of the present disclosure are capable of outputting green light much closer to pure green color.

The green material which is suitable for the green color filter layer of the present disclosure may be a green pigment, for example, including C.I. Pigment Green 36, C.I. Pigment Green 58, or a combination thereof, but the present disclosure is not limited thereto. These green pigments may comprise a material included a metal component, and the metal component may be selected from a group consisting of copper and zinc. The yellow material which is suitable for the green color filter layer in the present disclosure may be a yellow pigment, for example, including C.I. Pigment Yellow 138, C.I. Pigment Yellow 150, or a combination thereof, but the present disclosure is not limited thereto.

After the yellow material is added to the green color filter layer, the blue light transmittance in the range of the blue light band becomes lower to reduce the leakage of blue light. If too much yellow material is added, the output light efficiency of the green pixels may be reduced. Therefore, the adjustment of the amount or of the ratio of a weight of the yellow material may improve the luminous efficiency of the green pixels. On the contrary, if insufficient yellow material is added, the amount or the ratio of a weight of the yellow material is too small to reduce the leakage of blue light, possible to reduce the output light efficiency of green pixels, and blue light leakage may occur, to result in the pollution of pure green color. Therefore, by adjusting the mixing ratio of a weight of the green material and the ratio of a weight of the yellow material to a total weight of the green material and the yellow material, it is possible to improve the quality of the output light, and the leakage of blue light may be reduced, while the green pixels may output green light of better purity.

Figure 4:
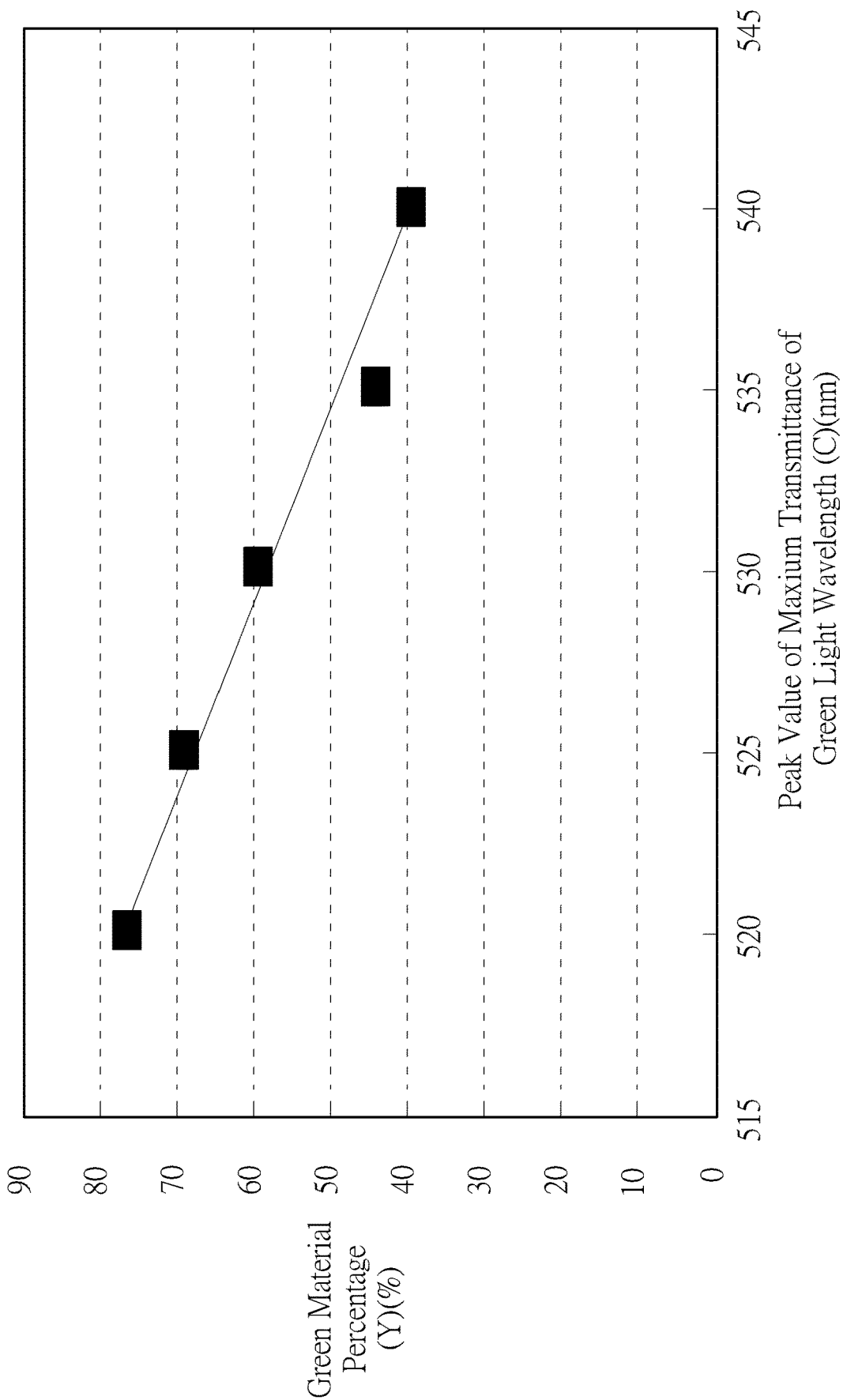
FIG. 4 is a schematic diagram showing the relationship between the peak value of the maximum transmittance of the green light wavelength and the different mixing ratios of a weight of the green material to a total weight of the green material and the yellow material in the green color filter layer of the display device according to the embodiment of the present disclosure.

FIG. 4 is a schematic diagram showing the relationship between the peak value of the maximum transmittance of the green light wavelength and the different mixing ratios of a weight of the green material to a total weight of the green material and the yellow material in the green color filter layer of the display device according to the embodiment of the present disclosure. It is observed in FIG. 4 that the peak value of the maximum transmittance of the green light wavelength of the green color filter layer accordingly changes when the ratio of a weight of the green material to a total weight of the green material and the yellow material changes. For example, when the green material is C.I. Pigment Green 36, the ratio of a weight of the green material to a total weight of the green material and the yellow material with the peak value of the maximum transmittance at 530 nm is 60%. In other words, the ratio of a weight of the yellow material to a total weight of the green material and the yellow material is 40%. Corresponding to different peak values of the highest transmittance of the green light wavelengths, the respective ratio of a weight of the green materials and of the yellow materials to a total weight of the green material and the yellow material may be from 80% and 20% to 40% and 60%, but the present disclosure is not limited thereto. When the green material is C.I. Pigment Green 36, the relationship between the peak value of the maximum transmittance (C, the unit is nm) of the green light wavelength and the mixing ratio (Y) of the green material can be described by the following formula:

$$Y = -1.85C + 1039$$

Therefore, by adjusting the ratio of a weight of the green material to a total weight of the green material and the yellow material, the peak value of the maximum transmittance of the green light wavelength of the green color filter layer may be substantially the same as the peak value of the emission of the green light wavelength conversion layer 141, which may improve the purity of the output light, or improve the green light intensity of the output light. In some embodiments, the ratio of a weight of the green material to a total weight of the green material and the yellow material is adjusted so that the peak value of the maximum transmittance of the green light wavelength of the green color filter layer is between 520 nm and 540 nm, that is, substantially the same as the peak value of the emission of the green light wavelength conversion layer 141 between 520 nm and 540 nm to improve the green light intensity of the output light of the display device. In some embodiments, by adjusting the ratio of a weight of the green pigment to a total weight of the green pigment and the yellow pigment, or the ratio of a weight of the green pigment to a total weight of the green pigment and the yellow dye, or the ratio of a weight of the green dye to a total weight of the green dye and the yellow pigment, or the ratio of a weight of the green dye to a total weight of the green dye and the yellow dye, the peak value of the maximum transmittance of the green light wavelength of the green color filter layer may be substantially the same as the peak value of the emission of the green light wavelength conversion layer 141 to improve the purity of the output light or to improve the green light intensity of the output light.

Figure 5:
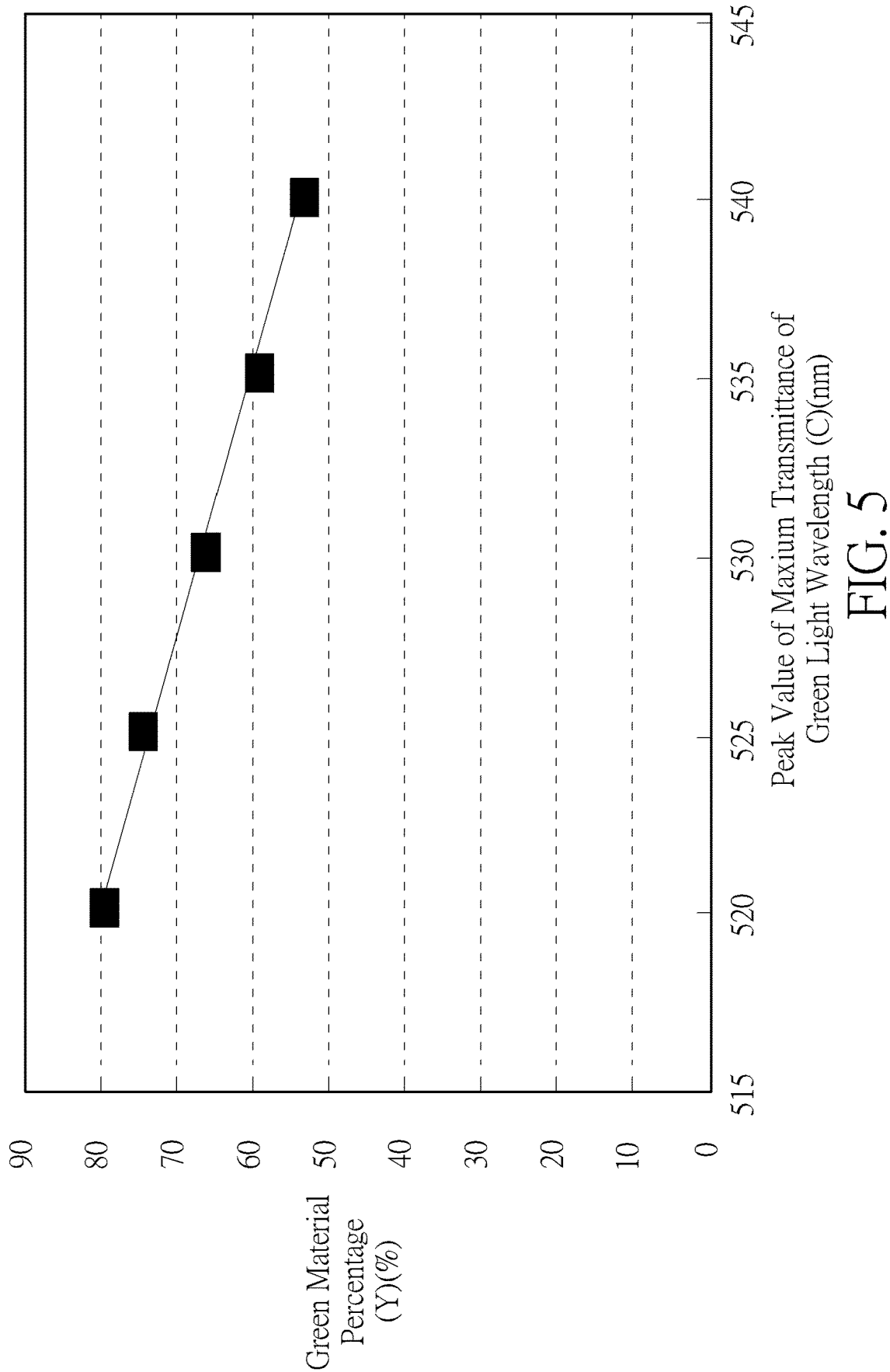
FIG. 5 is a schematic diagram showing the relationship between the peak value of the maximum transmittance of the green light wavelength and the different mixing ratios of a weight of the green material to a total weight of the green material and the yellow material in the green color filter layer of the display device according to the embodiment of the present disclosure.

FIG. 5 is a schematic diagram showing the relationship between the peak value of the maximum transmittance of the green light wavelength and the different mixing ratios of a weight of the green material to a total weight of the green material and the yellow material in the green color filter layer of the display device according to the embodiment of the present disclosure. It is observed in FIG. 5 that the peak value of the maximum transmittance of the green light wavelength of the green color filter layer accordingly changes when the ratio of a weight of the green material to a total weight of the green material and the yellow material changes. For example, when the green material is C.I. Pigment Green 58, the ratio of a weight of the green material to a total weight of the green material and the yellow material with the peak value of the maximum transmittance at 530 nm is 67%. In other words, the ratio a weight of the yellow material to a total weight of the green material and the yellow material is 33%. Corresponding to different peak values of the maximum transmittance of the green light wavelengths, the respective ratio of a weight of the green materials and of the yellow materials to a total weight of the green material and the yellow material may be from 80% and 20% to 50% and 50%, but the present disclosure is not limited thereto. When the green material is C.I. Pigment Green 58, the relationship between the peak value of the maximum transmittance (C, the unit is nm) of the green light wavelength and the mixing ratio (Y) of the green material can be described by the following formula:

$$Y = -1.3C + 756$$

Therefore, by adjusting the ratio of a weight of the green material to a total weight of the green material and the yellow material, the peak value of the maximum transmittance of the green light wavelength of the green color filter layer may be substantially the same as the peak value of the emission of the green light wavelength conversion layer 141, which may improve the purity of the output light, or improve the green light intensity of the output light. Please refer to the above descriptions for the procedures for the adjustment of the green material and the yellow material so the details are not elaborated again.

Figure 6A:
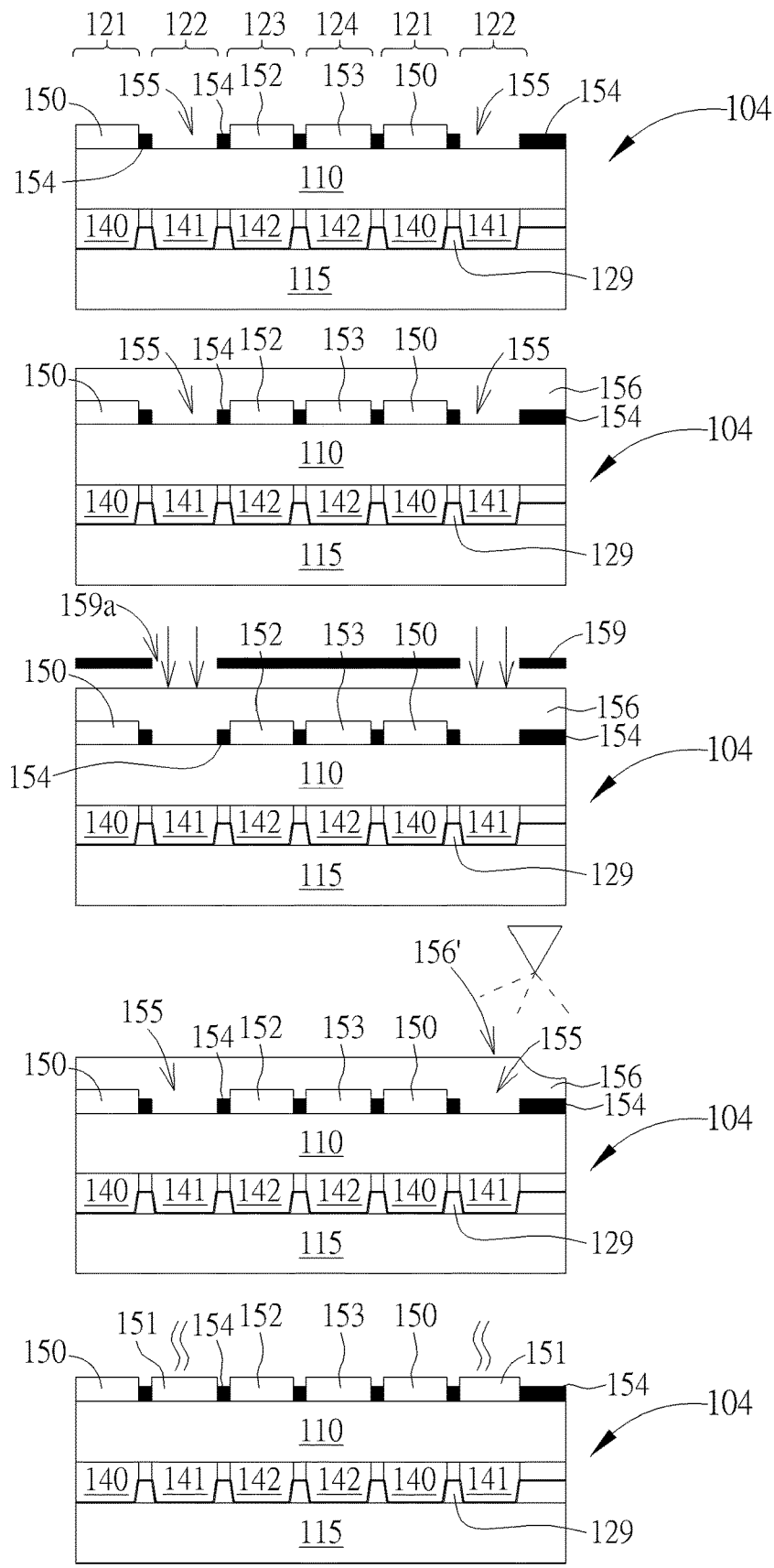
FIG. 6A is a schematic flow of a method for manufacturing a filter layer by a coating process for a bottom-emitting type display device according to one embodiment of the present disclosure.

FIG. 6A is a schematic flow of a method for manufacturing a filter layer by a coating process for a bottom-emitting type display device according to one embodiment of the present disclosure. This embodiment illustrates that the green color filter layer is formed at last, but the present disclosure is not limited thereto. First, some parts of the structure may have been formed in the display device 104 in advance. For example, in the display device 104, a plurality of color conversion elements including a red light wavelength conversion layer 140 and a green light wavelength conversion layer 141, and a plurality of color filter layers, for example, a red color filter layer 150 and a blue color filter layer 152, which correspond to the positions of the red pixel 121, the green pixel 122, the blue pixel 123 and the white pixel 124 may be formed on the carrier 115, and may be respectively disposed above the corresponding red pixel 121 and the blue pixels 123. The blue pixel 123 may be provided with a blue light wavelength conversion layer, or with a transparent material layer 142 without the need of providing a color conversion element, but the present disclosure is not limited thereto. There is no need to provide the white pixel 124 with a color conversion element, or a transparent material layer 142 may be provided, but the present disclosure is not limited thereto. Each pixel, such as the red pixel 121, the green pixel 122, the blue pixel 123, and the white pixel 124, may be defined by the pixel definition layer 129.

The substrate 110 may be disposed on a plurality of color conversion elements and cover the color conversion elements. A plurality of color filter layers, such as the red color filter layer 150 and the blue color filter layer 152, may be respectively disposed on the substrate 110 and arranged with respect to pixels of various colors. There is no need to provide the white pixel 124 with a color filter layer, or a transparent material layer 153 may be correspondingly provided, but the present disclosure is not limited thereto. There may be a thin film transistor (not shown) formed on the substrate 110, but the present disclosure is not limited thereto. The predetermined location 155 of the green color filter layer will be provided with a green color filter layer 151 in a subsequent step. In this embodiment, a light-shielding layer 154 (or a black matrix layer, BM) may be provided between the adjacent red color filter layer 150, the green color filter layer 151, the blue color filter layer 152, and the transparent material layer 153. The materials of the light-shielding layer 154 may include, for example, a black material, a black photoresist, a black printing ink, a black resin, other suitable materials, or a combination of the above materials, but present disclosure is not limited thereto.

First, the green color filter layer material 156 may be coated on the color filter layers, for example, the green color filter layer material 156 is used to cover the color filter layers and fill in the predetermined location 155 of the green color filter layer. The process for coating the green color filter layer material 156 may be a slit coating color filter layer material or a spin coating color filter layer material, but the present disclosure is not limited thereto.

The green color filter layer material 156 of the present disclosure may include a polymeric material monomer, a photoinitiator, a solvent, an additive, a dispersing agent, and a color material composition, but the present disclosure is not limited thereto. The color material composition may include a green material and a yellow material, but the present disclosure is not limited thereto. The green material may include a green pigment or a green dye, or a combination thereof, but the present disclosure is not limited thereto. The green pigment may comprise a material included a metal component, and the metal component may be selected from a group consisting of copper and zinc. The green pigment may include, for example, C.I. Pigment Green 36, C.I. Pigment Green 58 or a combination thereof, but the present disclosure is not limited thereto. The yellow material of the present disclosure may include a yellow pigment or a yellow dye, or a combination thereof, but the present disclosure is not limited thereto. The yellow pigment of the present disclosure may include, for example, C.I. Pigment Yellow 138, C.I. Pigment Yellow 150, or a combination thereof, but the present disclosure is not limited thereto. In the color material composition including the green material and the yellow material, the ratio of a weight of the green material to a total weight of the green material and the yellow material may be greater than or equal to 40%, and less than or equal to 80%.

Then, with the aid of the mask 159, an ultraviolet light curing process may be used to carry out an exposure step to cure the green color filter layer material 156, so that the green color filter layer material 156 disposed at the predetermined location 155 of the green color filter layer is cured. The mask 159 may have a pattern, such as an opening 159a, to assist the green color filter layer material 156 to be disposed at the predetermined location 155 of the green color filter layer and to be cured by the ultraviolet light. Next, a development step is carried out to remove the green color filter layer material 156 which is not cured by the ultraviolet light, while leaving the green color filter layer material 156' which is cured by the ultraviolet light. The process conditions of the development step to remove the green color filter layer material 156 which is not cured by the ultraviolet light may be at a temperature between 20° C. and 26° C.

To be continued, a suitable thermal curing method may be used to carry out a thermal curing step to cure the green color filter layer material 156' which is disposed at the predetermined location 155 of the green color filter layer and has been cured by the ultraviolet light to form the green color filter layer 151. The process conditions of the thermal curing step may be, for example, baking a green color filter layer material 156' which has a thickness about 1 μm (micrometer) to 12 μm and has been cured by the ultraviolet light at a temperature between 70° C. and 240° C. to form the green color filter layer 151. After the above steps, the green color filter layer 151 with the added yellow material of the present disclosure is obtained.

Figure 6B:
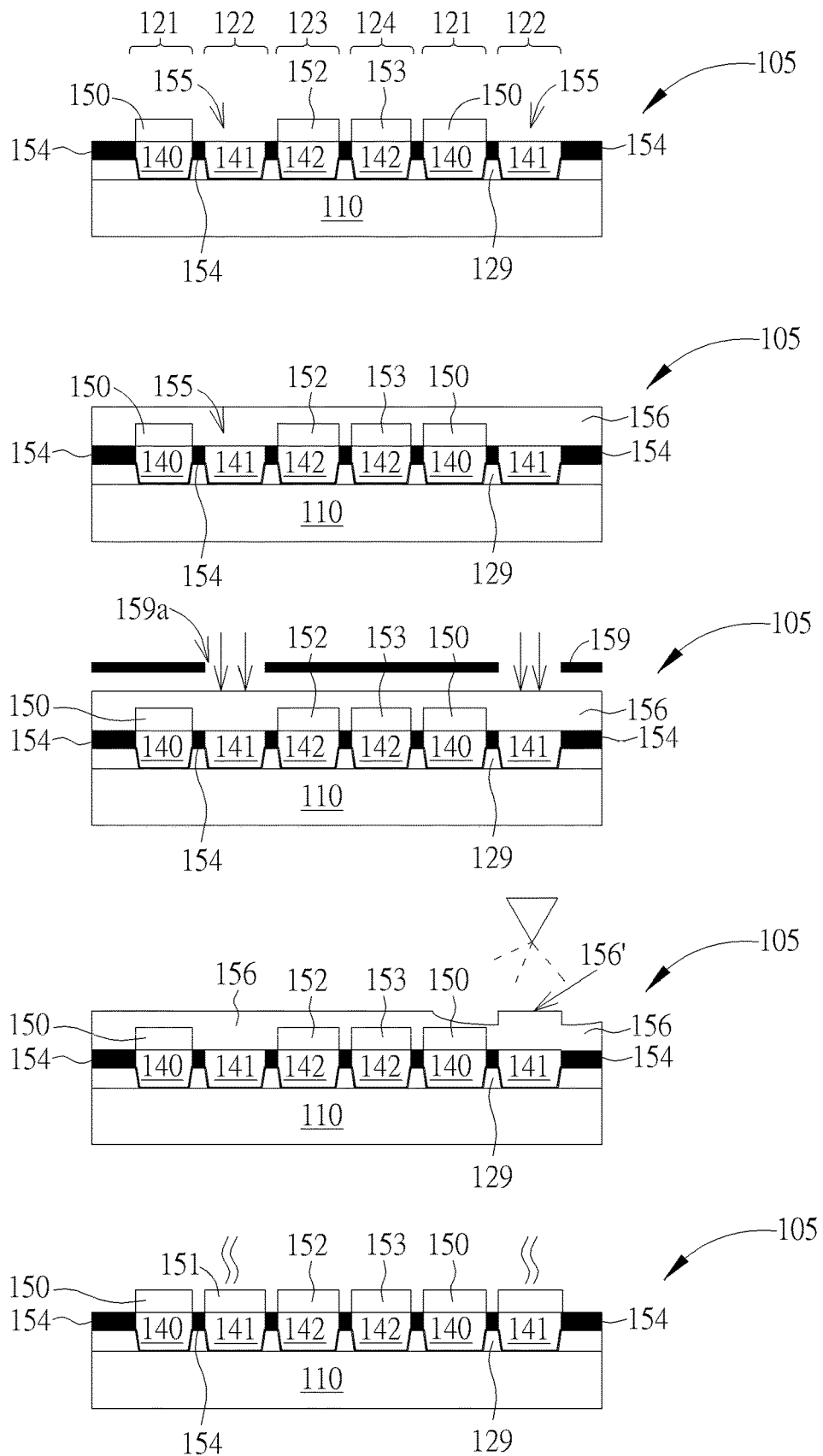
FIG. 6B is a schematic flow of a method for manufacturing a filter layer by a coating process for a top-emitting type display device according to another embodiment of the present disclosure.

FIG. 6B is a schematic flow of a method for manufacturing a color filter layer by a coating process for a top-emitting type display device according to another embodiment of the present disclosure. This embodiment illustrates that a green color filter layer is formed at last, but the present disclosure is not limited thereto. First, some parts of the structure of the display device 105 in FIG. 6B may have been formed in advance and may be similar to the display device 104 in FIG. 6A. The main difference between the two is that the color conversion element and the color filter layer are disposed on the same side of the substrate 110, so the similar structural parts will not be elaborated again.

In this embodiment, a plurality of color conversion elements are provided on the substrate 110 in advance, and light-shielding layers 154 may be provided between the adjacent red light wavelength conversion layers 140, the green light wavelength conversion layers 141, and the transparent material layers 142. The material of the light-shielding layer 154 may be the same as those described above, and details are not elaborated again.

Thereafter, a red color filter layer 150, a blue color filter layer 152, and a transparent material layer 153 are respectively disposed on the red light wavelength conversion layer 140, the transparent material layer 142, and the transparent material layer 142. After that, the green color filter layer material 156 may be coated on a plurality of color filter layers and on a plurality of color conversion elements, for example, the green color filter layer material 156 may cover the color filter layers and the color conversion elements accordingly, and fill in the predetermined location 155 of the green color filter layer. The process for coating the green color filter layer material 156 may be similar to those as described above, and details are not elaborated again.

The material composition of the green color filter layer material 156 for forming the green color filter layer 151 in this embodiment, as well as the process and conditions of exposure, development, and curing in this embodiment, may be similar to those as described above, and details are not elaborated again.

Figure 7A:
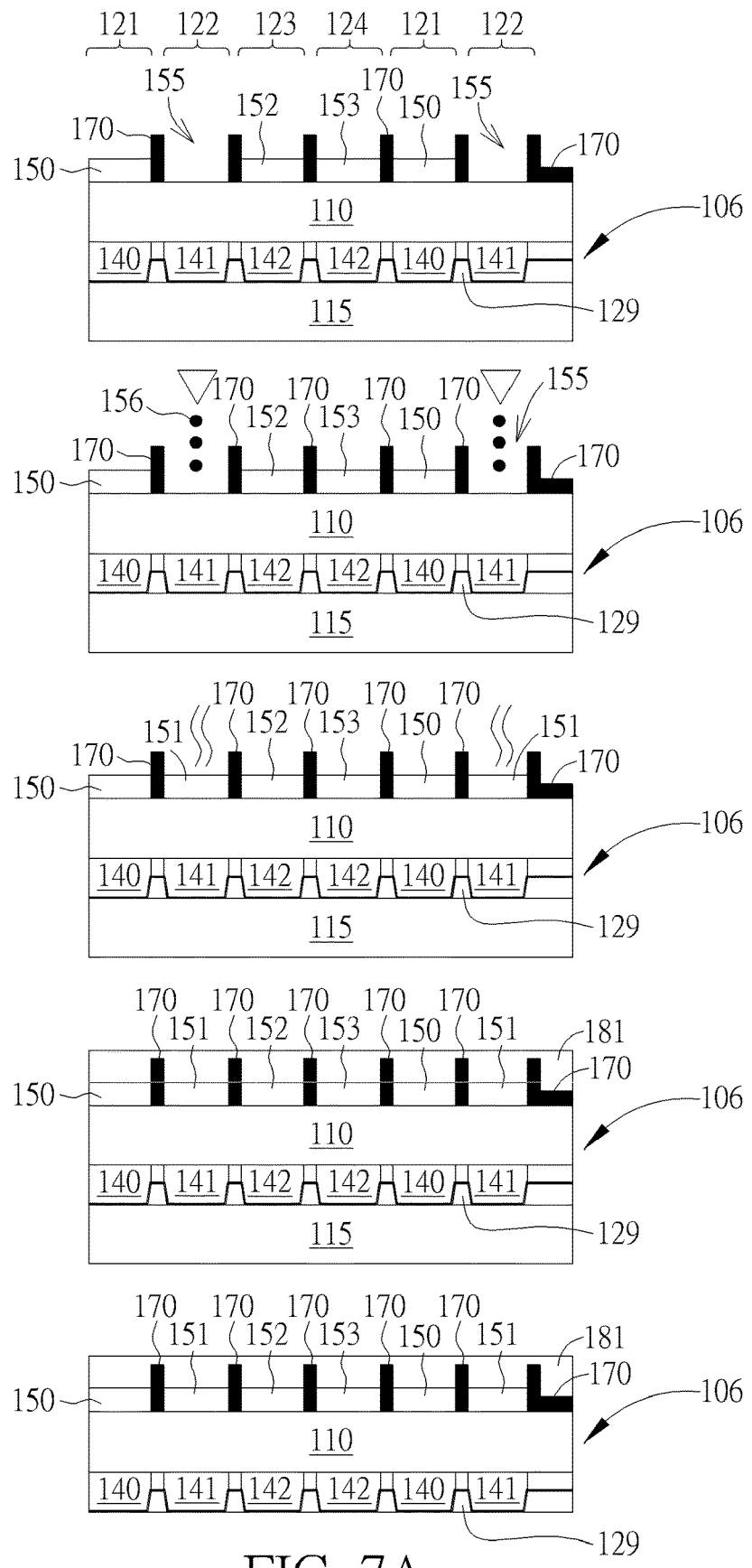
FIG. 7A is a schematic flow of a method of manufacturing a filter layer by an inkjet printing process for a bottom-emitting type display device according to another embodiment of the present disclosure.

FIG. 7A is a schematic flow of a method of manufacturing a filter layer by an inkjet printing process for a bottom-emitting type display device according to another embodiment of the present disclosure. This embodiment illustrates that a green color filter layer is formed at last, but the present disclosure is not limited thereto. First, some parts of the structure may have been formed in the display device 106 in advance. For example, in the display device 106, a plurality of color conversion elements including a red light wavelength conversion layer 140 and a green light wavelength conversion layer 141 and corresponding to the positions of the red pixel 121, the green pixel 122, the blue pixel 123 and the white pixel 124, may be formed on the carrier 115. The blue pixel 123 may be provided with a blue light wavelength conversion layer, or with a transparent material layer 142 without the need of providing a color conversion element, but the present disclosure is not limited thereto. There may be no need to provide the white pixel 124 with a color conversion element or a transparent material layer 142 may be provided, but the present disclosure is not limited thereto. Each pixel, such as the red pixel 121, the green pixel 122, the blue pixel 123, and the white pixel 124, may be defined by the pixel definition layer 129.

The substrate 110 may be disposed on a plurality of color conversion elements and cover the color conversion elements. A plurality of color filter layers, such as the red color filter layer 150 and the blue color filter layer 152, may be respectively disposed on the substrate 110, and correspond to pixels of various colors, such as the red pixels 121 and the blue pixels 123, to be accommodated within the space which is defined by the light-shielding isolation layer 170. There may be no need to provide the white pixel 124 with a color filter layer, or a corresponding transparent material layer 153 may be provided, but the present disclosure is not limited thereto. A thin film transistor (not shown) may be formed on the substrate 110, but the present disclosure is not limited thereto. The predetermined location 155 of the green color filter layer which is defined by the light-shielding isolation layer 170 may be provided with a green color filter layer 151 in a subsequent step. In this embodiment, between the adjacent red color filter layer 150, the green color filter layer 151, the blue color filter layer 152 and the transparent material layer 153, a light-shielding isolation layer 170 may be provided and the material of the light-shielding isolation layer 170 may include, for example, a black material, a black photoresist, a black printing ink, a black resin, other suitable materials or a combination of the above, but present disclosure is not limited thereto.

Next, the green color filter layer material 156 may fill in the predetermined location 155 of the green color filter layer by an inkjet printing process. The use of the inkjet printing process is beneficial to omit the use of a mask, to simplify the method of manufacturing the green color filter layer 151, and to reduce the amount of materials for use in the method.

The green color filter layer material 156 of the present disclosure may include a polymeric material monomer, a photoinitiator, a solvent, an additive, a dispersing agent, and a color material composition, but the present disclosure is not limited thereto. The color material composition may include a mixture of a green material and a yellow material, but the present disclosure is not limited thereto. The green material may include a green pigment or a green dye, or a combination thereof, but the present disclosure is not limited thereto. The green pigment may comprise a material included a metal component, and the metal component may be selected from a group consisting of copper and zinc. The green pigment may include, for example, C.I. Pigment Green 36, C.I. Pigment Green 58 or a combination thereof, but the present disclosure is not limited thereto. The yellow material of the present disclosure may include a yellow pigment or a yellow dye, or a combination thereof, but the present disclosure is not limited thereto. The yellow pigment of the present disclosure may include, for example, C.I. Pigment Yellow 138, C.I. Pigment Yellow 150, or a combination thereof, but the present disclosure is not limited thereto. In the color material composition including the green material and the yellow material, the ratio of a weight of the green material to a total weight of the green material and the yellow material may be greater than or equal to 40%, and less than or equal to 80%.

Then, the green color filter layer material 156 may be cured by carrying out a curing step using an appropriate thermal curing process, so that the green color filter layer material 156 disposed in a predetermined location 155 of the green color filter layer may be cured to form the green color filter layer 151. The process conditions of the thermal curing process may be, for example, baking the green color filter layer material 156 of a thickness about 1 μm to 12 μm at a temperature between 70° C. and 240° C. to cure the green color filter layer material 156. In addition to thermal curing, the green color filter layer material 156 may also be cured by using ultraviolet light. After the above steps, the green color filter layer 151 with the added yellow material of the present disclosure may be obtained.

To be continued, a thin film encapsulation method may be used to form the thin film encapsulation protection layer 181, so that the thin film encapsulation protection layer 181 may cover or protect the display device 106. Furthermore, the carrier 115 may be removed to obtain the display device.

Figure 7B:
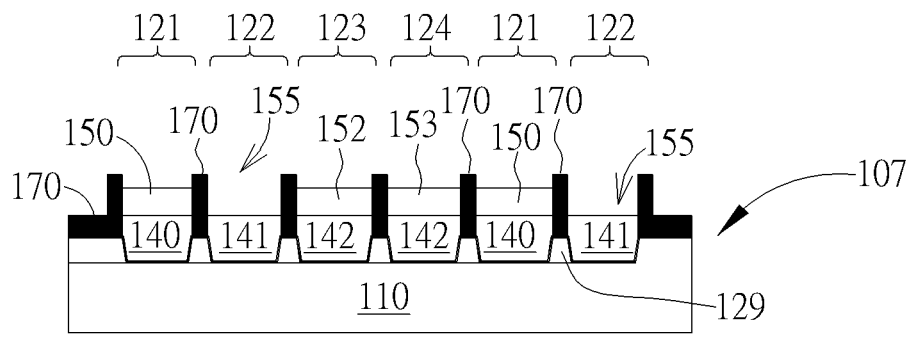
FIG. 7B is a schematic flow of a method of manufacturing a filter layer by an inkjet printing process for a top-emitting type display device according to another embodiment of the present disclosure.
Figure 7B:
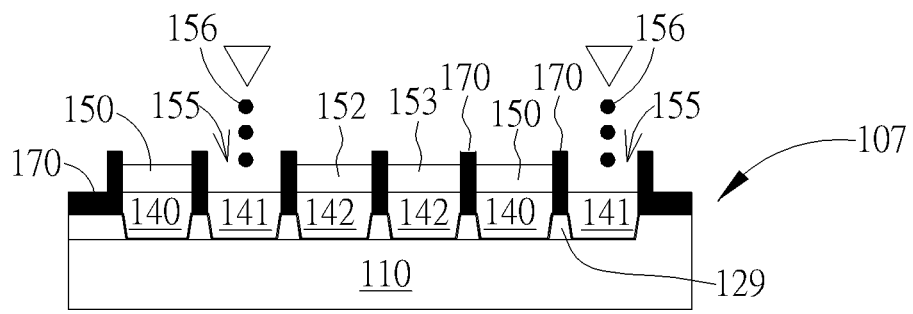
Figure 7B:
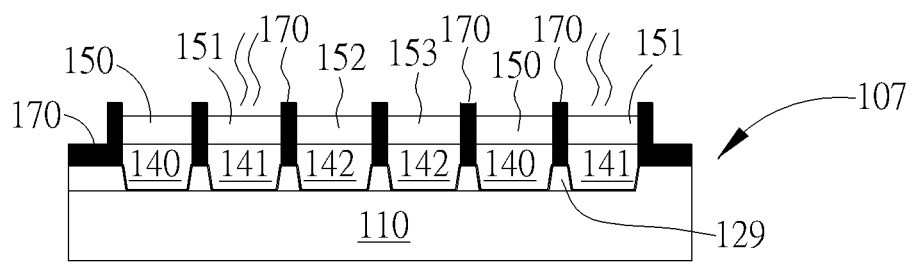
Figure 7B:
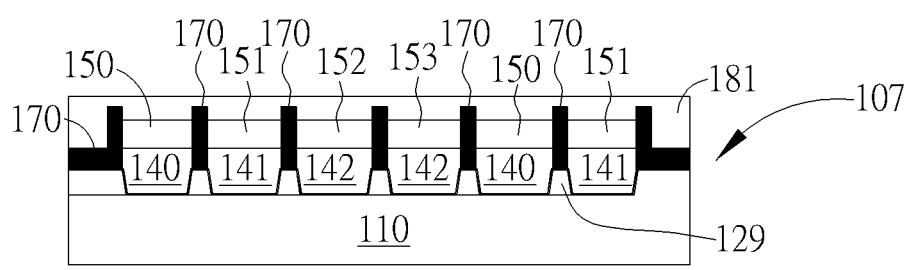

FIG. 7B is a schematic flow of a method of manufacturing a color filter layer by an inkjet printing process for a top-emitting type display device according to another embodiment of the present disclosure. This embodiment illustrates that a green color filter layer is formed at last, but the present disclosure is not limited thereto. First, some parts of the structure of the display device 107 in FIG. 7B may be formed in advance and similar to the display device 106 in FIG. 7A. The main difference between the two is that the color conversion element and the color filter layer are disposed on the same side of the substrate 110, so the similar structural parts will not be elaborated again.

In this embodiment, a plurality of color conversion elements are disposed on the substrate 110, then the red color filter layer 150, the blue color filter layer 152, and the transparent material layer 153 are respectively disposed on the red light wavelength conversion layer 140, the transparent material layer 142 and the transparent material layer 142.

After that, similar to the steps described above, the green color filter layer material 156 may fill in the predetermined location 155 of the green color filter layer by an inkjet printing process. Please refer to the above for the procedures and advantages of the inkjet printing process and the details are not elaborated again.

The material composition of the green color filter layer material 156 for forming the green color filter layer 151 in this embodiment, as well as the curing process and conditions, may be similar to those as described above, and details are not elaborated again.

To be continued, a thin film encapsulation (TFE) method may be used to form the thin film encapsulation protection layer 181, so that the thin film encapsulation protection layer 181 may cover or protect the display device 107 to obtain the display device.

According to the display device in each embodiment of the present disclosure, adding a yellow material to the green color filter layer may reduce the possibility of blue light leakage, so that the green pixels in the display device of the present disclosure may output green light close to a purer green color. In addition, by adjusting the ratio of a weight of the green material to a total weight of the green material and the yellow material in the green color filter layer, the peak value of the maximum transmittance of the green light wavelength of the green color filter layer may be substantially the same as the peak value of the emission of the green light wavelength conversion layer. In such a way, the blue light leakage may be reduced, or the intensity of the green light output from the green pixel 122 may be accordingly improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
    a substrate;
    a light-emitting layer disposed on the substrate;
        a green light wavelength conversion layer disposed on the light-emitting layer;
        a color filter layer disposed on the green light wavelength conversion layer;
        a shielding layer adjacent to the green light wavelength conversion layer; and
        a light mixed with blue light and yellow light generated by the light-emitting layer passing through the green light wavelength conversion layer and then passing through the color filter layer;
    wherein the color filter layer comprises a green pigment and a yellow pigment.

2. The display device according to claim 1, wherein a ratio of a weight of the green pigment to a total weight of the green pigment and the yellow pigment is greater than 40% and less than 80%.

3. The display device according to claim 2, wherein the green pigment comprises a material selected from a group consisting of copper and zinc.

4. The display device according to claim 3, wherein the green pigment is C.I. Pigment Green 36.

5. The display device according to claim 3, wherein the green pigment is C.I. Pigment Green 58.

6. The display device according to claim 1, further comprising:
 a metal layer electrically connected with the light-emitting layer, and overlapped the shielding layer.

7. The display device according to claim 1, further comprising:
 a protection layer disposed on the color filter layer, and disposed in the shielding layer.

* * * * *